United States Patent [19]

Chuang et al.

[11] Patent Number: 5,089,724
[45] Date of Patent: Feb. 18, 1992

[54] HIGH-SPEED LOW-POWER ECL/NTL CIRCUITS WITH AC-COUPLED COMPLEMENTARY PUSH-PULL OUTPUT STAGE

[75] Inventors: Ching-Te K. Chuang, South Salem; Denny D. Tang, Pleasantville, both of N.Y.

[73] Assignee: International Business Machines Corporation, Armonk, N.Y.

[21] Appl. No.: 620,498

[22] Filed: Nov. 30, 1990

[51] Int. Cl.[5] .......................................... H03K 19/013
[52] U.S. Cl. ..................... 307/454; 307/443; 307/455; 307/246; 307/270
[58] Field of Search ............... 307/443, 246, 454–456, 307/496, 270, 255, 296.1

[56] References Cited

U.S. PATENT DOCUMENTS

| | | | |
|---|---|---|---|
| 3,541,353 | 11/1970 | Seelbach et al. | 307/446 |
| 3,753,008 | 8/1973 | Guarnaschelli | 307/270 |
| 3,866,063 | 2/1975 | Long | 307/313 X |
| 3,955,146 | 5/1976 | Brennan | 330/17 |
| 4,103,188 | 7/1978 | Morton | 307/446 X |
| 4,458,162 | 7/1984 | Solomon et al. | 307/456 |
| 4,477,741 | 10/1984 | Moser, Jr. | 307/443 X |
| 4,626,709 | 12/1986 | Mazumder et al. | 307/246 X |
| 4,754,171 | 6/1988 | Dasai et al. | 307/455 |
| 4,780,764 | 10/1988 | Kinoshita | 358/213.19 |
| 4,810,903 | 3/1989 | Bushey et al. | 307/443 X |
| 4,868,904 | 9/1989 | Gravrok et al. | 307/443 |
| 4,874,970 | 10/1989 | Coy et al. | 307/455 X |
| 4,906,869 | 3/1990 | Masuoka | 307/455 |
| 4,926,065 | 5/1990 | Coy et al. | 307/455 X |
| 4,939,393 | 7/1990 | Petty | 307/443 X |
| 4,943,740 | 7/1990 | Gulczynski | 307/454 |
| 4,970,416 | 11/1990 | Tamegaya | 307/455 |

FOREIGN PATENT DOCUMENTS 178018 3/1989 Japan.

OTHER PUBLICATIONS

Usami, M., et al., "SPL (Super Push-Pull Logic) A Bipolar Novel Low-Power High-Speed Logic Circuit", Dig. of Tech. Papers, Symp. on VLSI Circs., pp. 11–12 (May 1989).
Chuang, C. K. et al., "High-Speed ECL Circuit", IBM Technical Disclosure Bulletin, 32(4A):374 (1989) (Chuang I).
Chuang, C. K. et al., "High-Speed Low-Power Charge-Buffered Active Pull-Down ECL Circuit", IEEE 1990 Bipolar Circuits and Technology Meeting 613, pp. 132–135 (1990) (Chuang II).

*Primary Examiner*—David Hudspeth
*Attorney, Agent, or Firm*—Scully, Scott, Murphy & Presser

[57] ABSTRACT

High-speed low-power emitter coupled logic (ECL) and non-threshold logic (NTL) circuits are disclosed wherein an ac-coupled complementary push-pull output stage is utilized. The circuits utilize two capacitors to couple an ac-pulse derived from a replica of an input signal to the bases of the complementary PNP-NPN push-pull transistors to provide a large transient current, thus realizing high-speed operation with very low dc power dissipation. The coupling scheme allows a very low switch current to be used for the logic (current switch) stage to maintain the proper logic levels while avoiding the impact on the switching speed by the large pull-up resistors of the logic stage.

12 Claims, 2 Drawing Sheets

HIGH-SPEED LOW-POWER ECL/NTL CIRCUITS WITH AC-COUPLED COMPLEMENTARY PUSH-PULL OUTPUT STAGE

BACKGROUND OF THE INVENTION

1. Field of the Invention

The present invention relates generally to bipolar transistor logic circuits, and more particularly, to emitter coupled logic (ECL) and non-threshold logic (NTL) circuits wherein the dc power dissipation and switching current are greatly reduced by utilizing an ac-coupled complementary push-pull output stage.

2. Description of the Prior Art

The design of high-speed bipolar circuits is often a compromise between speed, power consumption, and current drive capability. Faster switching speeds can be achieved at the expense of higher power dissipation and a larger switch current, and lower power dissipation can be achieved but at the expense of slower switching speeds. For example, FIG. 1 is a schematic diagram of a conventional ECL circuit 1. The input signal is applied to the bases of transistors 2 and 3 which are differentially coupled to transistor 4. Since the output is taken from node A, the output will perform a NOR function of the input signals. The base of transistor 4 is tied to a reference voltage $V_{REF}$ which is equal to the median between the logical high voltage and the logical low voltage of the integrated circuit 1. Transistor 5 and resistor 9 provide a current source for differential transistors 2, 3 and 4.

When the input signal to the base of transistor 3 is a logical low voltage, transistor 3 is off, and transistor 4 is on. The current provided by transistor 5 and resistor 9 flows through transistor 4. The voltage at node A is high. The output is taken from node A through transistor 6 which is connected in an emitter follower configuration. Thus, the output will be a high output voltage. When the input rises from a logical low voltage to a logical high voltage, transistor 3 will switch on and transistor 4 will switch off once the input signal crosses $V_{REF}$. As transistor 3 switches on, node A will fall from a high voltage to a low voltage pulling the base of transistor 6 low and providing a low output voltage. The output is pulled down from a high output voltage to a low output voltage through resistor 10 to discharge the load capacitor $C_L$. Load capacitor $C_L$ consists of the capacitances of any driven gates and wiring capacitance. The time required to pull down the output is determined by the time required for the input signal to rise from a logical low voltage to $V_{REF}$, the time required to pull down the voltage at node A, and the time needed to discharge capacitor $C_L$ from a high output voltage to a low output voltage through resistor 10. The latter time is determined by a time constant which is obtained by multiplying the resistance of resistor 10 by the capacitance of capacitor $C_L$. Thus, in order to achieve a fast pull-down, resistor 10 must be as low as possible. However, this results in a higher dc current $I_{EF}$ and, thus, higher power dissipation. In addition, the dc current $I_{EF}$ during stand-by and during switching is the same which results in high dc power dissipation.

When the input switches from a logical high voltage to a logical low voltage, transistor 3 will switch off, and transistor 4 will switch on. The base of transistor 6 is pulled high through resistor 7 thereby turning transistor 6 on strongly to charge the output node and provide a high output voltage. ECL circuit 1 is limited in its operation when pulling up the output by the need to provide the drive current for transistor 6 through resistor 7. ECL circuit 1 is further limited in that the switching current $I_{CS}$ is the same whether it is flowing through resistor 7 and transistor 3 or through resistor 8 and transistor 4 because the current source, transistor 5 and and resistor 9, supplies the same $I_{CS}$ regardless of which differential transistor is on. Thus, resistor 7 and resistor 8 have the same resistance values. The time required to pull up the output is determined by the time required for the input signal to fall from a logical high voltage to $V_{REF}$, the time required to pull up the voltage at node A through resistor 7 which determines the time needed to charge capacitor $C_L$ from a low output voltage to a high output voltage through emitter follower transistor 6. Therefore, in order to achieve a fast pull-up of the voltage at node A, resistor 7, and thus resistor 8, must be selected as low as possible. However, the switching current $I_{CS}$ is inversely proportional to resistors 7 and 8 for a fixed voltage swing. Thus, a small value for resistors 7 and 8 will result in a large switching current $I_{CS}$.

As described above, there are two problems with high speed conventional ECL circuits: (1) the pull-down delay is limited by resistor 10. Thus, high speed operation means a small resistor value for resistor 10 and high dc current $I_{EF}$. (2) The pull-up delay is limited by resistors 7 and 8. Thus, a fast pull-up means small resistors 7 and 8 and a large switch current $I_{CS}$.

A circuit which has been developed to overcome the first problem in ECL circuit 1 is described in C.K. Chuang and K.Y Toh, "High-Speed ECL Circuit," Vol. 32 No. 4A IBM Tech. Discl. Bull. 374-380 (1989). This circuit reduces the dc power dissipation by implementing a low power ac-coupled active pull-down (APD) emitter follower output stage. In the APD-ECL, resistor 10 is replaced by an NPN pull-down transistor with a collector connected to the output node, an emitter returned to $V_{EE}$ and a base ac-coupled through a capacitor to the collector of transistor 4.

In the APD-ECL circuit, the base of the pull-down transistor is biased to maintain a low steady state current. As in conventional ECL circuit 1, when the input signal rises from a logical low voltage to a logical high voltage, node A will fall from a high voltage level to a low voltage level and emitter follower transistor 6 is cutoff. At the same time the voltage at the collector of transistor 4 rises from a low voltage level to a high voltage level, and this signal is ac-coupled to the base of the pull-down transistor. The coupling capacitor couples a transient voltage pulse to the base of the pull-down transistor, thereby turning on the pull-down transistor strongly and briefly to provide a large transient pull-down current. Thus, a small emitter follower current $I_{EF}$ can be used while still maintaining a fast pull-down. The pull-up transistor is turned off momentarily, thus, further improving the pull-down delay.

The APD-ECL is faster, and the output transition from a high output voltage to a low output voltage is steeper than the discharge through resistor 10 in conventional ECL circuit 1. This is because the current used to discharge capacitor $C_L$ is supplied by the pull-down transistor which has a much smaller time constant than the passive pull-down in circuit 1. The power dissipation in the emitter follower stage of the APD-ECL is much less than that of circuit 1 because the dc current in the output stage is small during stand-by and momentarily raised up during switching, whereas in circuit 1, $I_{EF}$ is at the same value during stand-by and when circuit 1 switches. A secondary advantage of the APD-ECL circuit stems from the fact that the steady state current through the emitter follower transistor 6 is low, and therefore, the output high voltage is approximately 100 mV closer to $V_{CC}$ than in conventional ECL circuit 1. Thus, a lower $V_{CC}$ may be used which further reduces the dc power dissipation in the APD-ECL circuit.

Although the APD-ECL circuit is an improvement over conventional ECL circuit 1, the former circuit does not overcome the second problem stated above. A large switching current $I_{CS}$ is still necessary to achieve fast switching of the logic stage, especially for the pull-up which is still limited by pull-up resistors 7 and 8.

FIG. 2 is a schematic diagram of a conventional non-threshold logic (NTL) circuit 11. The operation and power/speed performance of conventional NTL circuit 11 is similar to that described above for ECL circuit 1 except for the differences discussed below. In NTL circuit 11 there is no reference transistor differentially coupled to the input transistors 12 and 13, and as a result, the voltage at the base of the emitter follower transistor 14 will immediately rise or fall when the input falls or rises. Thus, the delay component in ECL circuit 1 attributable to the time it takes for the input signal to rise to $V_{REF}$ during pull-up, is not present in NTL circuit 11. In addition, because no reference voltage is required, NTL circuit can be operated with a lower power supply than conventional ECL circuit 1, and therefore, dissipates less dc power than ECL circuit 1.

The two problems present in ECL circuit 1 are also present in conventional NTL circuit 1: (1) the pull-down delay is limited by resistor 18. Thus, high speed operation means a small resistor value for resistor 18 and high dc current $I_{EF}$. (2) The pull-up delay is limited by pull-up resistor 15. Thus, a fast pull-up means a small pull-up resistor 15 and a large switch current $I_{CS}$.

A circuit which has been developed to overcome the first problem in NTL circuit 1 is described in M. Usami and N. Shiozawa, "SPL (Super Push-Pull Logic) A Bipolar Novel Low-Power High-Speed Logic Circuit," Dig. of Tech. Papers, Symp. on VLSI Cirs., 11-12, May, 1989. The SPL circuit is similar in operation to the APD-ECL in that the SPL circuit reduces dc power dissipation by utilizing an ac-coupled active pull-down transistor. In the SPL circuit the base of a pull-down transistor is ac-coupled to the emitter(s) of the input transistors via a capacitor. The collector of the pull-down transistor is coupled to the emitter of the output emitter follower transistor 14 and to the output node and the emitter of the pull-down transistor is returned to $V_{EE}$. The capacitor couples a transient voltage pulse to the base of the pull-down transistor, thereby turning on the pull-down transistor providing a large transient pull-down current. However, the SPL circuit does not overcome the second problem stated above. A large switching current $I_{CS}$ is still necessary to achieve fast switching of the logic stage, especially for the pull-up which is still limited by pull-up resistor 15.

SUMMARY OF THE INVENTION

The present invention is directed to ECL and NTL circuits with an ac-coupled complementary push-pull output stage which enables the circuits to operate at high speeds with minimum dc power dissipation and small switching current $I_{CS}$. Similar to a conventional ECL circuit, the present ECL circuit has multiple input transistors which are differentially coupled to a reference transistor. The switching current $I_{CS}$ is drawn from the common emitter node and the signal at the common collector node of the input transistors is applied to the base of an emitter follower transistor. The output is taken from the emitter of the emitter follower transistor which is connected to the common collector node of a pair of complementary push-pull (PNP-NPN) transistors. A biasing means is provided in order to bias the complementary transistors at cut-in ('NEARLY ON') condition and maintain a low stand-by current at the output stage. A pulse coupling means, which is connected between the common emitter node of the input transistors and the bases of the complementary transistors, is used to apply a transient voltage pulse derived from a replica of an input signal to said bases to momentarily render one complementary transistor heavily conductive and turn the other one off. This will result in a large transient current flow in the conductive transistor thereby providing a fast pull-up or pull-down of the voltage at the output node.

When the input signal rises from a logical low to a logical high, the voltage at the common emitter node will follow once the input signal rises above a reference voltage. This signal is then ac-coupled through two capacitors into the bases of the complementary push-pull transistors. The capacitors will provide a positive voltage pulse which will turn off the pull-up PNP transistor and turn on the pull-down NPN transistor, thereby providing a large transient pull-down current to discharge the load capacitor. This results in a faster output transition from a high output voltage to a low output voltage than in a conventional ECL circuit. This is because the discharging current of the load capacitor is supplied by the pull-down NPN transistor which has a much smaller time constant than that of the passive pull-down of the conventional ECL circuit. The power dissipation in the output stage is greatly reduced because the dc current is small during stand-by and only momentarily raised up during switching.

When the input falls, the voltage at the common emitter node of the input transistors immediately follows and oppositely directed pulses are applied to the complementary push-pull transistors via the two capacitors. This will switch the pull-up PNP transistor heavily on and the pull-down NPN transistor off quickly and momentarily, thereby providing a large transient pull-up current. A small amount of pull-up current is also supplied by the output emitter follower transistor. Thus, the pull-up current is mostly supplied by the pull-up PNP transistor and only a small fraction is supplied by the output emitter follower transistor. The pull-up delay is no longer dependent on the pull-up resistors. The pull-up resistors are used merely for setting the output logic levels through the emitter follower transistor. Large pull-up resistors, and thus a small switching current $I_{CS}$, can now be used without degrading the speed because they are no longer in the pull-up delay path. As a result, the present ECL circuit can be operated with less dc power dissipation and a lower switching current $I_{CS}$ than the conventional ECL and APD-ECL circuits.

The operation and improvements in power dissipation, speed and switching current of the ac-coupled complementary push-pull ECL circuit are equally applicable to the disclosed ac-coupled complementary push-pull NTL circuit. Thus, the disclosed NTL circuit can be operated with less dc power dissipation and a lower switching current than the conventional NTL and SPL circuits.

DETAILED DESCRIPTION OF THE INVENTION

Figure 1:
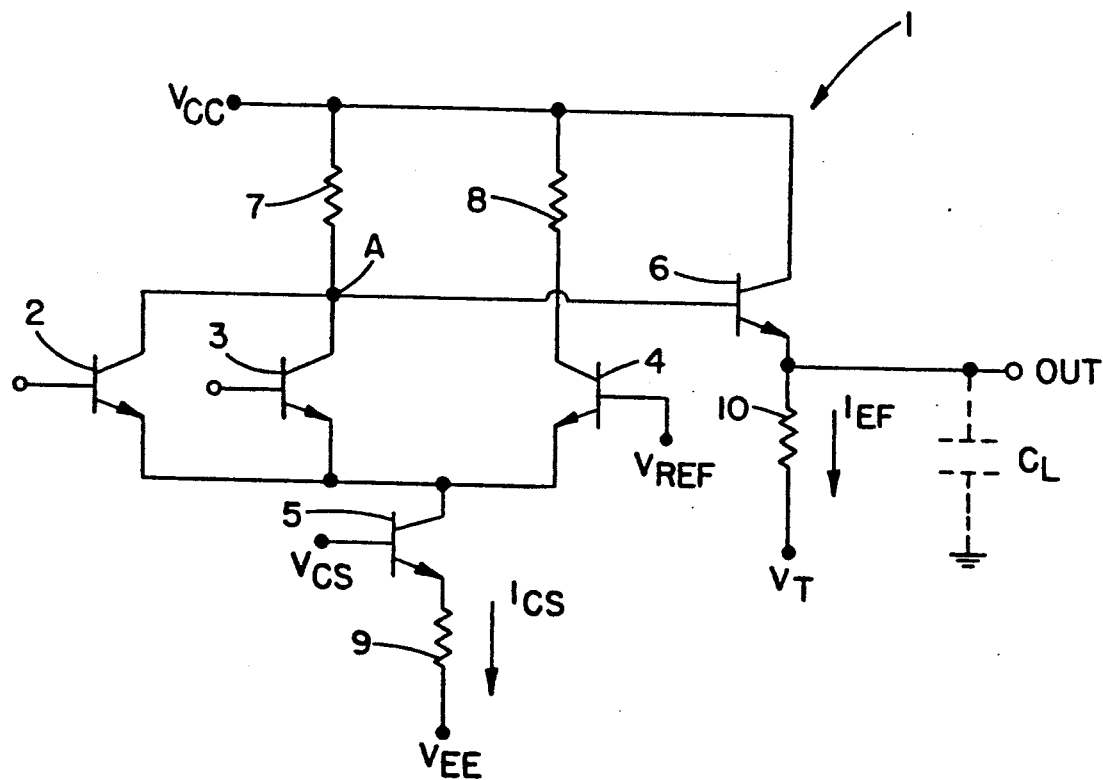
FIG. 1 is a schematic diagram of a prior art ECL circuit.
Figure 2:
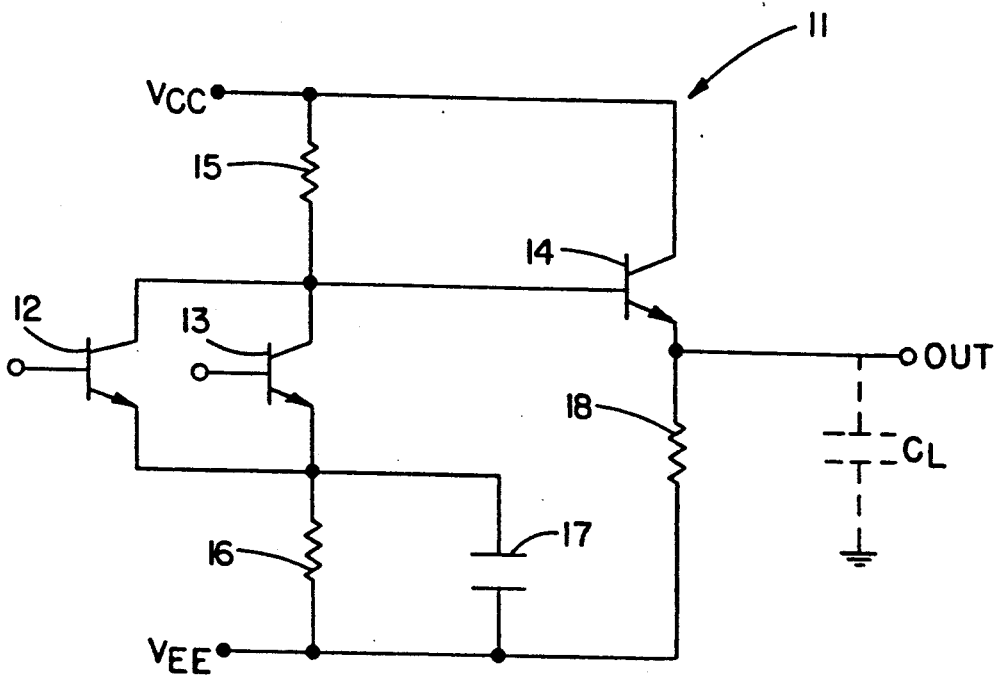
FIG. 2 is a schematic diagram of a prior art NTL circuit.
Figure 3:
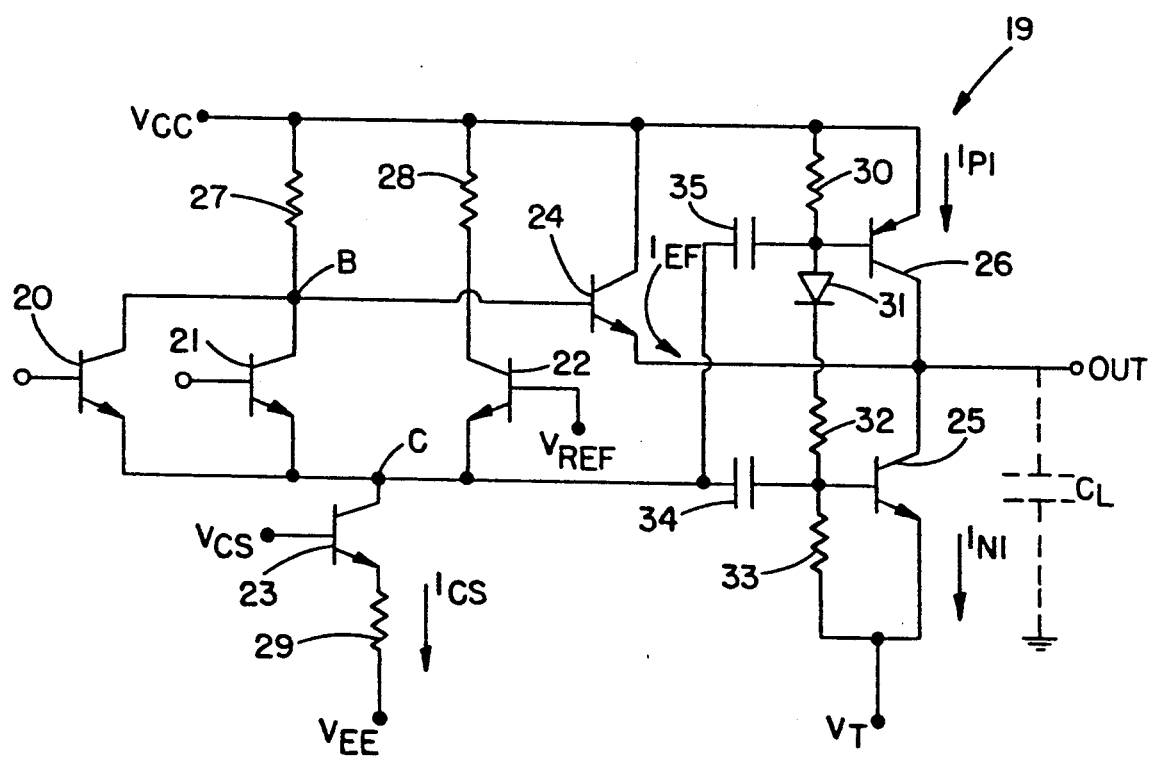
FIG. 3 is a schematic diagram of an ECL circuit which utilizes an ac-coupled complementary push-pull output stage in accordance with the present invention.

FIG. 3 is a schematic diagram of an ECL circuit 19 which utilizes an ac-coupled complementary push-pull output stage. The ECL circuit 19 improves the power/speed performance of ECL circuitry by allowing a very low switching current $I_{CS}$ to be used for the logic (current switch) stage to maintain the proper logic levels while eliminating the impact on the switching speed by the large pull-up resistors 27 and 28 of the logic stage.

In FIG. 3, ECL circuit 19 includes a plurality of NPN bipolar transistors 20-25 and one PNP bipolar transistor 26. ECL circuit 19 is designed to be operated with two or three voltage levels supplied. The current trend in ECL circuitry is to use three voltage levels. The first level is $V_{CC}$, the second level is $V_T$ which is at a lower voltage than $V_{CC}$ and the third level is $V_{EE}$ which is at a lower voltage than $V_T$. ECL circuit 19 also includes at least one input transistor 21 which is differentially coupled to reference transistor 22. Additional input transistors can be connected in parallel with input transistor 21 as shown by transistor 20. Transistor 23 and resistor 29 provide switching current $I_{CS}$ to differential transistors 21 and 22. The base of transistor 22 is tied to a reference voltage $V_{REF}$ which is equal to the median between the logical high voltage and logical low voltage of ECL circuit 19. A power supply $V_{CC}$ is connected to the collector of transistor 21 via resistor 27 and the collector of transistor 22 via resistor 28. Transistor 24 is connected in an emitter-follower configuration wherein the base of transistor 24 is connected to the collector of transistor 21, and the emitter of transistor 24 is connected to the output. The collector of transistor 24 is directly connected to the power supply $V_{CC}$.

The voltage at common emitter node C of the input transistors is ac-coupled to the bases of complementary transistors 25 and 26 via capacitors 34 and 35, respectively. The collector of transistor 25 is connected to the collector of transistor 26, both of which are connected to the output terminal. The emitter of transistor 25 is connected to the voltage supply $V_T$ and the emitter of transistor 26 is connected to the voltage supply $V_{CC}$. ECL circuit 19 further includes a biasing circuit which consists of resistors 30, 32 and 33 and diode 31. The biasing circuit is used to bias transistors 25 and 26 at cut-in ('NEARLY ON') condition, thereby establishing a stand-by current in transistors 25 and 26.

When the input signal falls from a logical high to a logical low, transistor 21 will be switched off and transistor 22 will be switched on. Thus, the switching current $I_{CS}$ supplied by transistor 23 and resistor 29 will be switched from transistor 21 to transistor 22. The voltage at node B will rise from a low voltage to a high voltage.

Since the output is taken from the emitter of transistor 24, the output voltage will rise from a low output voltage to a high output voltage. The voltage at common emitter node C will immediately follow the input signal until the input crosses $V_{REF}$ and at that point will remain at $V_{REF}$ minus the base to emitter voltage of transistor 22 $V_{BE22}$. Thus, the signal at node C will be a replica of the input signal in that when a logical high is at the input, the voltage at node C will equal the logical high voltage minus $V_{BE21}$ and when the input is a logical low, the voltage at node C will equal $V_{REF}$ minus $V_{BE22}$. Transistors 25 and 26 are biased at cut-in condition by resistors 30, 32, and 33 and diode 31 to maintain a low stand-by current in transistors 25 and 26. The voltage signal at common emitter node C is ac-coupled to the bases of the complementary push-pull transistors 25 and 26 via capacitors 34 and 35, respectively. Capacitors 34 and 35 will couple a negative voltage pulse derived from a replica of the input signal to the bases of transistors 25 and 26, thereby turning off pull-down NPN transistor 25 and turning on pull-up PNP transistor 26 quickly and momentarily, providing a large transient pull-up current $I_{P1}$. Transistors 25 and 26 will then quickly return to stand-by condition.

During the pull-up transition, node B will be pulled high by resistor 27. Thus, during the time that the large transient current $I_{P1}$ is flowing through transistor 26, a smaller amount of pull-up current $I_{EF}$ will be flowing through transistor 24 into the output node. Thus, the output is pulled up from a low output voltage to a high output voltage mostly by the pull-up current $I_{P1}$ from transistor 26 and only to a very small degree by $I_{EF}$ from transistor 24. As a result, resistor 27 is no longer in the pull-up delay path as in conventional ECL circuit 1 and the APD-ECL circuit. Resistors 27 and 28 will have the same resistance values because the switching current $I_{CS}$ is the same regardless of whether it is flowing through resistor 27 and transistor 21 or through resistor 28 and transistor 22. Resistors 27 and 28 are used merely for setting the output logic levels through the emitter follower transistor 24. Thus, large resistances for resistors 27 and 28, and hence a small switching current $I_{CS}$, can now be used without degrading the speed. The dc power dissipation of ECL circuit 19 is much less than the conventional ECL and APD-ECL circuits because a lower switching current $I_{CS}$ can now be used while still achieving fast switching of the logic stage.

When the input signal rises from a logical low to a logical high, the voltage at common emitter node C will follow once the input crosses $V_{REF}$ thereby providing a replica of the input signal. When the input crosses $V_{REF}$, transistor 21 will be switched on, while transistor 22 will be switched off. The voltage at node B will fall from a high voltage to a low voltage. Thus, the output will fall from a high output voltage to a low output voltage. Capacitors 34 and 35 will couple a positive voltage pulse derived from the replica signal to the bases of transistors 25 and 26, thereby heavily turning on pull-down NPN transistor 25 and turning off pull-up PNP transistor 26 quickly and momentarily, providing a large transient pull-down current $I_{N1}$ to quickly discharge the output node.

This results in an improvement in dc power dissipation over the conventional ECL circuit, because a low stand-by $I_{N1}$ is maintained and a large transient $I_{N1}$ is used only during switching. Moreover, the speed is improved because the pull-down delay in ECL circuit 19 is no longer limited by an emitter follower resistor as in conventional ECL circuit 1.

The pull-down delay of ECL circuit 19 is still longer than the pull-up delay as in the APD-ECL circuit. This is because when the input rises from a logical low to a logical high, the voltage at common emitter node C will follow only after the input crosses the reference volta $V_{REF}$ whereas when the input falls from a logical high to a logical low, the voltage at common emitter node C follows the input immediately. Note that for conventional ECL circuit 1, the switching of the current will not occur until the input crosses the reference voltage in both transitions.

The power supplies and input/output voltage levels of circuit 19 are compatible with conventional ECL circuits and, thus, can be mixed with conventional ECL circuits on the same chip.

Figure 4:
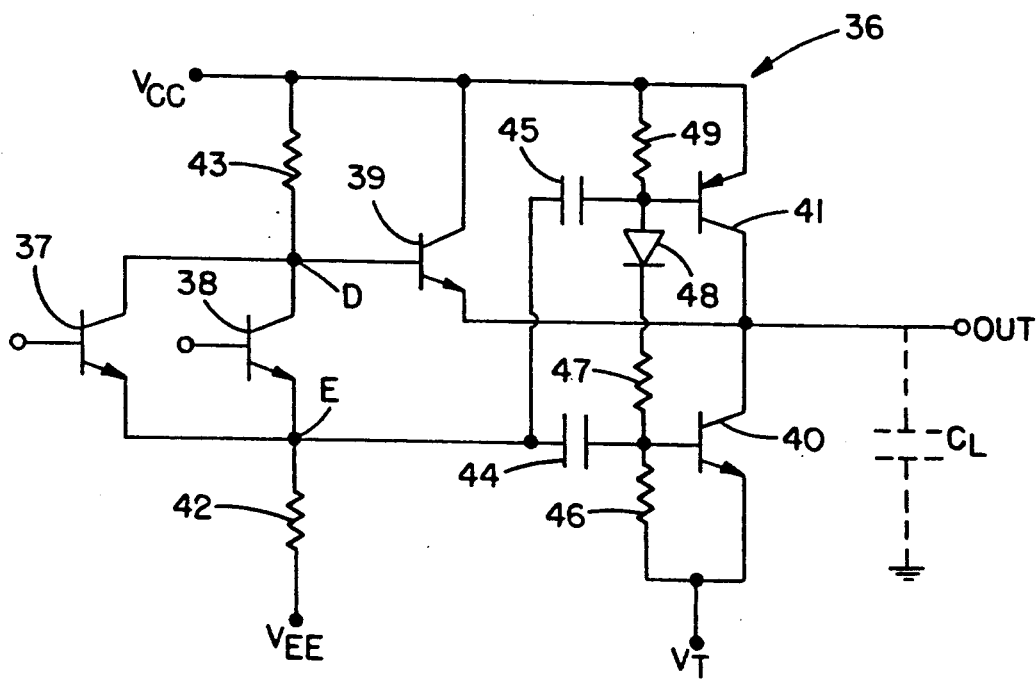
FIG. 4 is a schematic diagram of an NTL circuit which utilizes an ac-coupled complementary push-pull output stage in accordance with the present invention.

FIG. 4 is a schematic diagram of an NTL circuit 36 which utilizes an ac-coupled complementary push-pull output stage. NTL circuit 36 improves the power/-speed performance of NTL circuitry by allowing a very low switch current to be used for the logic stage to maintain the proper logic levels while eliminating the impact on the switching speed by pull-up resistor 43 of the logic stage.

In FIG. 4 NTL circuit 39 includes a plurality of NPN bipolar transistors 37–40 and one PNP bipolar transistor 41. NTL circuit 36 is designed to be operated with two or three voltage levels supplied. The current trend in NTL circuitry is to use three voltage levels. The first voltage source is $V_{CC}$, the second level is $V_T$ which is at a lower voltage than $V_{CC}$ and the third level is $V_{EE}$ which is at a lower voltage than $V_T$. NTL circuit 36 includes at least one input transistor 38. Additional input transistors can be connected in parallel with input transistor 38 as shown by transistor 37. The output performs a NOR function of the input signals. AC-coupling means are provided by capacitors 44 and 45 which are connected to the bases of complementary push-pull transistors 40 and 41. NTL circuit 36 also includes a biasing circuit which consists of resistors 46, 47, and 49 and diode 48. The biasing circuit is used to bias transistors 40 and 41 at cut-in condition, thereby establishing a stand-by current in transistors 40 and 1.

NTL circuit 36 achieves a reduction in dc power dissipation and switching current without degrading the speed. The characteristics and power/speed performance of the NTL circuit 36 are similar to that of ECL circuit 19 except for the differences which will be discussed below in connection with the operation of NTL circuit 36.

When the input signal falls from a logical high to a logical low, the voltage at node E will immediately follow. The voltage signal at node E is ac-coupled to the bases of transistors 40 and 41 via capacitors 44 and 45, respectively. Capacitors 44 and 45 will couple a negative voltage pulse to the bases of transistors 40 and 41, thereby switching on transistor 41 heavily and momentarily, providing a large transient pull-up current to charge up the output node. As in ECL circuit 19, a much smaller amount of pull-up current will also be supplied by transistor 39. Thus, the output is pulled up from a low output voltage to a high output voltage mostly by transistor 41 and only to a very small degree by transistor 39. As a result, resistor 43 is no longer in the pull-up delay path as it is in conventional NTL circuit 11 and the SPL circuit. Resistor 43 is used merely for setting the output logic levels through emitter follower transistor 39. Thus, a large resistor 43, and hence a small switching current, can be used without degrading the speed. In addition, the dc power dissipation of NTL circuit 36 is much less than conventional NTL circuit 11 or the SPL because a lower switching current can be used while still achieving fast switching of the logic stage.

When the input signal rises from a logical low to a logical high, the voltage at node E will immediately follow. Capacitors 44 and 45 will couple a positive voltage pulse to the bases of transistors 40 and 41, turning on transistor 40 heavily and turning off transistor 41 quickly and momentarily thereby providing a large transient pull-down current to quickly discharge the output node.

This results in an improvement in dc power dissipation over conventional NTL circuit 11 because a low stand-by current is maintained in the output stage, and a large transient current is used only during switching. Moreover, the switching speed is improved because the pull-down delay in NTL circuit 36 is no longer limited by an emitter follower resistor as in conventional NTL circuit 11. Thus, NTL circuit 36 will dissipate less dc power and achieve faster switching than conventional NTL circuit 11 and the SPL circuit.

As can be seen by comparing ECL circuit 19 with NTL circuit 36, the latter circuit does not utilize a reference transistor. This results in two advantages for NTL circuit 36 over ECL circuit 19. First, there is no time delay in pull down attributable to the time it takes for the input signal to reach $V_{REF}$ when it is rising. Second, because no reference voltage is required in NTL circuit 36, a lower power supply can be used in NTL circuit 36 and thus less dc power will be dissipated. However, the noise margin of NTL circuit 36 is worse than that of ECL circuit 19.

While the invention has been particularly shown and described with respect to illustrative and preferred embodiments thereof, it will be understood by those skilled in the art that the foregoing and other changes in form and details may be made therein without departing from the spirit and scope of the invention which should be limited only by the scope of the appended claims.

Having thus described the invention, what is claimed as new and what is desired to be secured by Letters Patent is:

1. An ac-coupled complementary pull-up and pull-down circuit comprising:
at least a pair of input bipolar transistors connected in parallel, the emitters of which are connected to a first circuit node and the collectors of which are connected to a second circuit node and the bases of which are circuit input terminals;
a pair of complementary bipolar transistors, a first of said pair of complementary transistors having an emitter terminal connected to a first voltage source, a collector terminal connected to an output terminal and a base, and a second of said pair of complementary transistors having an emitter terminal connected to a second voltage source, a collector terminal connected to said output terminal and a base; and
pulse coupling means connected to said first circuit node for applying simultaneously to the bases of said pair of complementary transistors an ac pulse derived from a replica of an input signal applied to said input terminal thereby rendering one of said complementary transistors momentarily conductive and the other non-conductive such that a large transient current flows in said conductive transistor.

2. The circuit of claim 1 wherein said pulse coupling means comprises:
a first capacitor having a first plate connected to said first circuit node and a second plate connected to said base of said first complementary transistor; and
a second capacitor having a first plate connected to said first circuit node and a second plate connected to said base of said second complementary transistor.

3. The circuit of claim 2 further comprising:
a first transistor having a base terminal connected to said second circuit node, a collector terminal connected to said first voltage source and an emitter terminal connected to said output terminal;
a first resistor having a first terminal connected to said first voltage source and a second terminal connected to said base of said first complementary transistor;
a diode having an anode connected to said base of said first complementary transistor and a cathode;
a second resistor having a first terminal connected to said cathode of said diode and a second terminal connected to said base of said second complementary transistor; and
a third resistor having a first terminal connected to said base of said second complementary transistor and a second terminal connected to said second voltage source.

4. The circuit of claim 3 further comprising:
a fourth resistor having a first terminal connected to said first voltage source and a second terminal connected to said second circuit node; and
a fifth resistor having a first terminal connected to said first circuit node and a second terminal connected to a third voltage source.

5. The circuit of claim 3 further comprising:
a fourth resistor having a first terminal connected to said first voltage source and a second terminal connected to said second circuit node;
a fifth resistor having a first terminal connected to said first voltage source and a second terminal;
a second transistor having a collector terminal connected to said second terminal of said fifth resistor, a base terminal connected to a first bias voltage and an emitter terminal connected to said first circuit node; and
a current source means connected to said first circuit node.

6. The circuit of claim 5 wherein said current source means comprises:
a third transistor having a collector terminal connected to said first circuit node, a base terminal connected to a second bias voltage and an emitter terminal; and
a sixth resistor having a first terminal connected to said emitter terminal of said third transistor and a second terminal connected to a third voltage source.

7. An ac-coupled complementary pull-up and pull-down circuit comprising:
at least one input bipolar transistor having an emitter terminal connected to a first circuit node, a collector terminal connected to a second circuit node and a base terminal which is a circuit input terminal;

a first transistor having a base terminal connected to said second circuit node, a collector terminal connected to a first voltage source and an emitter terminal connected to an output terminal;
a pair of complementary bipolar transistors, a first of said pair of complementary transistors having an emitter terminal connected to said first voltage source, a collector terminal connected to said output terminal and a base, and a second of said pair of complementary transistors having an emitter terminal connected to a second voltage source, a collector terminal connected to said output terminal and a base; and
pulse coupling means connected to said first circuit node for applying simultaneously to the bases of said pair of complementary transistors an ac pulse derived from a replica of an input signal applied to said input terminal thereby rendering one of said complementary transistor momentarily conductive and the other non-conductive such that a large transient current flows in said conductive transistor.

8. The circuit of claim 7 wherein said pulse coupling means comprises:
a first capacitor having a first plate connected to said first circuit node and a second plate connected to said base of said first complementary transistor; and
a second capacitor having a first plate connected to said first circuit node and a second plate connected to said base of said second complementary transistor.

9. The circuit of claim 8 further comprising a biasing circuit which comprises:
a first resistor having a first terminal connected to said first voltage source and a second terminal connected to said base of said first complementary transistor;
a diode having an anode connected to said base of said first complementary transistor and a cathode;
a second resistor having a first terminal connected to said cathode of said diode and a second terminal connected to said base of said second complementary transistor; and
a third resistor having a first terminal connected to said base of said second complementary transistor and a second terminal connected to said second voltage source.

10. The circuit of claim 9 further comprising:
a fourth resistor having a first terminal connected to said first voltage source and a second terminal connected to said second circuit node; and
a fifth resistor having a first terminal connected to said first circuit node and a second terminal connected to a third voltage source.

11. The circuit of claim 9 further comprising:
a fourth resistor having a first terminal connected to said first voltage source and a second terminal connected to said second circuit node;
a fifth resistor having a first terminal connected to said first voltage source and a second terminal;
a second transistor having a collector terminal connected to said second terminal of said fifth resistor, a base terminal connected to a first bias voltage and an emitter terminal connected to said first circuit node; and
a current source means connected to said first circuit node.

12. The circuit of claim 11 wherein said current source means comprises:

a third transistor having a collector terminal connected to said first circuit node, a base terminal connected to a second bias voltage and an emitter terminal; and a sixth resistor having a first terminal connected to said emitter terminal of said third transistor and a second terminal connected to a third voltage source.

* * * * *